United States Patent [19]

Lundberg

[11] Patent Number: 4,963,766

[45] Date of Patent: Oct. 16, 1990

[54] LOW-VOLTAGE CMOS OUTPUT BUFFER

[75] Inventor: James R. Lundberg, Hubbardston, Mass.

[73] Assignee: Digital Equipment Corporation, Maynard, Mass.

[21] Appl. No.: 372,670

[22] Filed: Jun. 28, 1989

[51] Int. Cl.$^5$ .................. H03K 19/094; H03K 19/20; H03K 17/687; H03K 19/003

[52] U.S. Cl. .................................. 307/451; 307/473; 307/562; 307/568

[58] Field of Search ............... 307/448, 473, 450, 451, 307/443, 475, 446, 570, 585, 558, 562, 568, 542

[56] References Cited

U.S. PATENT DOCUMENTS

| | | | |
|---|---|---|---|
| 4,472,647 | 9/1984 | Allgood et al. | 307/475 |
| 4,704,547 | 11/1987 | Kirsch | 307/443 |
| 4,717,846 | 1/1988 | Ando | 307/473 |
| 4,772,812 | 9/1988 | Desmarais | 307/473 |
| 4,782,250 | 11/1988 | Adams et al. | 307/473 |
| 4,800,303 | 1/1989 | Graham et al. | 307/558 X |
| 4,806,797 | 2/1989 | Yamazaki | 307/446 |
| 4,806,801 | 2/1989 | Argade et al. | 307/568 X |
| 4,820,942 | 4/1989 | Chan | 307/473 X |
| 4,855,623 | 8/1989 | Flaherty | 307/473 X |
| 4,864,164 | 9/1989 | Ohshima et al. | 307/451 X |
| 4,866,304 | 9/1989 | Yu | 307/451 X |
| 4,878,943 | 11/1989 | Uragami et al. | 307/473 |
| 4,880,997 | 11/1989 | Steele | 307/473 X |

Primary Examiner—Stanley D. Miller
Assistant Examiner—David R. Bertelson
Attorney, Agent, or Firm—Arnold, White & Durkee

[57] ABSTRACT

A CMOS push-pull output buffer is powered by a low-voltage (e.g., +3.3 V) supply, but is able to withstand elevation of its output node to higher voltage without sinking large currents into the low-voltage supply. Thus, this buffer is able to operate tied to a bus that has various higher-voltage sources also operating on the bus. The P-channel pull-up transistor of this buffer has another P-channel transistor connecting its gate to the output node so that this gate will follow the voltage of the output node and thus keep the pull-up transistor from conducting from the output node to the power supply. The inverter which drives this gate of the P-channel pull-up transistor is also protected from reverse current into its low-voltage power supply by a series N-channel transistor which will exhibit body effect and is sized to present a significant resistance.

20 Claims, 2 Drawing Sheets

LOW-VOLTAGE CMOS OUTPUT BUFFER

BACKGROUND OF THE INVENTION

This invention relates to output buffer circuits for semiconductor integrated circuit devices, and more particularly to CMOS circuits for driving an output bus using low-voltage supplies.

When the transistor sizes used in integrated circuit devices are scaled to smaller dimensions to allow larger numbers of the devices to be constructed on a chip, it is preferable to lower the voltages used to supply the chip to reduce degradation caused by so-called "hot electron" effects. Further, the power dissipation and the switching speed in integrated circuit devices can be reduced by operating the devices at lower voltages. MOS integrated circuit devices such as microprocessor and memory circuits have for many years operated with +5 V power supplies, but currently many devices are being designed to operate with lower voltage supplies, such as +3.3 V. The lower supply voltage reduces hot electron effects and also reduces the power dissipation in each transistor. This lower power dissipation becomes quite important when hundreds of thousands of transistors are included on a single chip. In addition, the switching speed is reduced because the voltage swing between one logic level and the other is less.

Even though some recently-designed MOS integrated circuit devices are able to operate at these lower supply voltages, there are many MOS and bipolar devices which still use the traditional +5 V supplies. Particularly, almost all memory devices currently available are manufactured for use with +5 V supplies, and so a microprocessor device using a +3.3 V supply must be able to operate on a bus with these +5 V memory devices. Preferably, devices of each type of supply voltage should be able to share the same busses, without requiring separate interface circuits. A microprocessor chip using low-voltage supplies should be able to directly interface with memory chips using high-voltage supplies. Input protection devices commonly employed at all input pads of an MOS chip allow overvoltage without harm, so a low-voltage chip can accept higher-voltage logic levels at its input. Likewise, the inputs pads of a higher-voltage chip are usually specified to accept TTL logic levels, which are lower than the 5 V MOS levels, and so the low-voltage outputs can readily drive the inputs of the higher-voltage chip. A problem can arise, however, at the output terminals of the low-voltage chip; when several drivers are connected to a bus, as is the case for a main system bus of a microprocessor system, for example, and when some of the drivers are on low voltage chips while others are on higher-voltage chips, the situation of a higher voltage being present on the bus while the outputs of the low-voltage chip are tri-stated results in the possibility that the higher voltage on the bus will sink current into the lower-voltage power supply through the pull-up transistors of the output buffers of the low-voltage chip. Since there are perhaps thirty-two or sixty-four of these output buffers driving a system bus from a microprocessor chip, the current overload caused by this effect could be catastrophic, both for the +5 V driving chip and the +3.3 V receiving chip. Previously, this current sinking effect has been avoided by stacking two transistors instead of one pull-up transistor, but this has needlessly increased the chip size; the output buffer generally employs the largest transistor sizes on a typical chip, and since there are perhaps thirty-two or sixty-four of these output buffers for the main data bus alone, the use of stacked transistors is not tolerable.

Even if a +3.3 V CMOS output buffer is driving only a single-source bus, i.e., point-to-point, the bus can be driven to above +3.3 V by the receiver's input circuitry or by other means, and so the improved circuit of the invention is useful in such a situation as well.

Thus it would be desirable to provide an improved way of interfacing integrated circuit devices employing low-voltage logic levels (and thus low-voltage power supplies) with other chips using higher-voltage logic levels. It would also be desirable to provide an improved output buffer circuit using a low-voltage supply, wherein the circuit will tolerate overvoltage on its output node without sinking current from the output node into the power supply of the circuit. In addition, it would be desirable to provide an improved, smaller-sized (thus lower-cost and lower-power) output buffer circuit for use in interfacing to higher voltage logic levels.

SUMMARY OF THE INVENTION

In accordance with one embodiment of the invention, a CMOS push-pull output buffer is powered by a low-voltage (e.g., +3.3 V) supply, but is able to withstand elevation of its output node to higher voltage (e.g., +5 V) without sinking large currents into the low-voltage supply. Thus, this buffer is able to operate efficiently when tied to a bus which has various higher-voltage sources also operating on the bus. The P-channel pull-up transistor of this output buffer has an arrangement to allow the gate to follow the voltage of the output node, so the pull-up transistor is held in the off condition rather than turning on as would be the case if the gate stayed at the low-voltage supply level, i.e., +3.3 V. This arrangement, in one embodiment, includes another P-channel transistor connecting the gate of the output pull-up transistor to the output node so that this gate will follow the voltage of the output node (when the output node exceeds the low supply voltage plus the P-channel threshold voltage) and thus keep the pull-up transistor from conducting from the output node to the power supply. The inverter which drives this gate of the output P-channel pull-up transistor is also protected from reverse current into its low-voltage power supply by an arrangement which serves to drop the voltage before reaching the inverter P-channel pull-up transistor; in one embodiment this is accomplished by a series N-channel transistor (having its gate tied to the high-voltage supply) which will exhibit body effect and is sized to present a significant resistance. Another possibility for undesirable sinking of current when the output buffer is tristated is the PN junction between the source/drain of the P-channel pull-up transistor on the output node and its N-well; this junction could become forward biased when the output node is above the supply voltage level of the chip. To avoid this forward-biased condition, the higher voltage power supply (the logic level of the external chips) is connected to the N-well of the low voltage output buffer. As noted, the gate of the series N-channel transistor is tied to the high-voltage supply, and this is done so that the output P-channel pull-up transistor can be deasserted with a full +3.3 V. If the series N-channel transistor had the low-voltage supply on its gate, the drive voltage to the output P-channel pull-up transistor would be limited to about +2.7 V due to the body effect.

BRIEF DESCRIPTION OF THE DRAWINGS

The novel features believed characteristic of the invention are set forth in the appended claims. The invention itself, however, as well as other features and advantages thereof, will be best understood by reference to a detailed description of a specific embodiment which follows, when read in conjunction with the accompanying drawings, wherein:

DETAILED DESCRIPTION OF SPECIFIC EMBODIMENT

Figure 1:
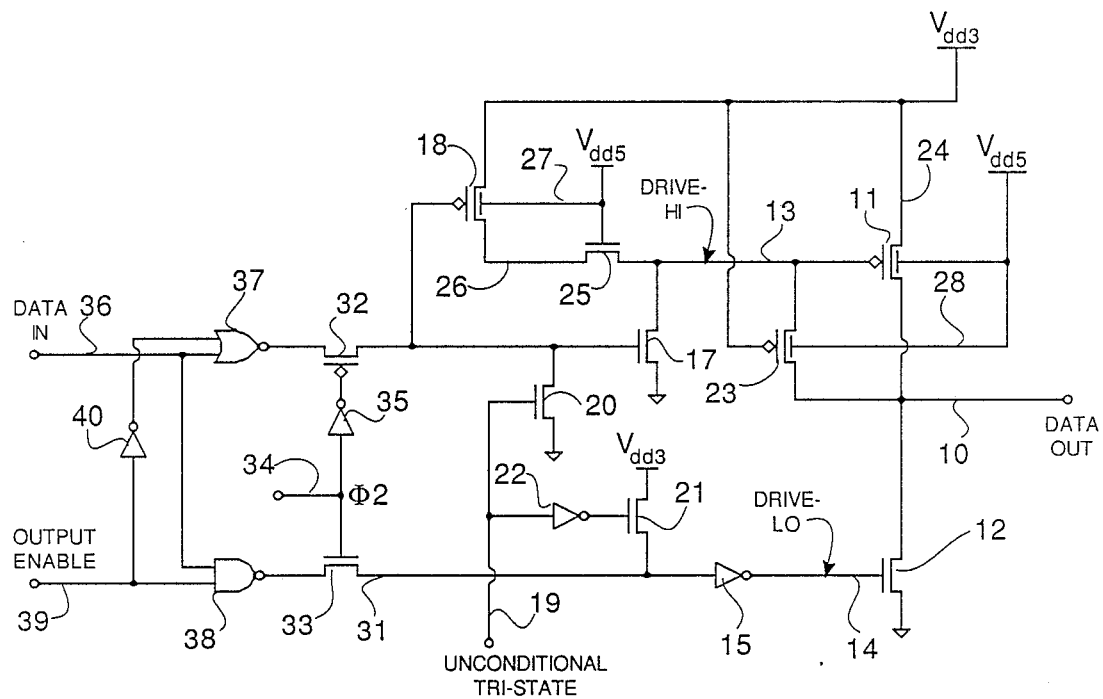
FIG. 1 is an electrical schematic diagram of a CMOS output buffer circuit employing features of the invention.

Referring to FIG. 1, a CMOS tri-state output buffer circuit according to one embodiment of the invention is illustrated. An output node 10 is driven in a push-pull manner by a p-channel pull-up output transistor 11 and an N-channel pull-down output transistor 12. The source-to-drain paths of these two transistors 11 and 12 are connected in series between $V_{ss}$ node ("ground") and a low-voltage +3.3 V supply $V_{dd3}$. Drive voltages "Drive-hi" and "Drive-lo" are applied to the gates 13 and 14 of the transistors 11 and 12, respectively. the Drive-lo voltage is at a high level (about +3.3 V or logic "1") to turn on the pull-down transistor 12 and drive the output 10 to logic "0" (in this example, $V_{ss}$); this Drive-lo voltage is applied to the gate 14 by an inverter 15. The Drive-hi voltage is at a low or logic "0" level to turn on the pull-up transistor 11 and drive the output 10 high; this Drive-hi voltage is applied to the gate 13 from an input 16 via an inverter stage including an N-channel pull-down transistor 17 and a P-channel pull-up transistor 18. In the normal driving situation (i.e., with data output to the node 10) the Drive-hi voltage and the Drive-lo voltage are at the same logic level.

To tri-state the output node 10, both of the output transistors 11 and 12 are turned off, so the output node 10 sees a high impedance to both $V_{ss}$ and the power supply $V_{dd3}$. To invoke the tri-state condition, an input 39 is driven low, and this deasserts both nodes 13 and 14.

According to a feature of the invention, the circuit of FIG. 1 is adapted to allow the output node 10 to go above the voltage of the supply $V_{dd3}$ when the circuit is in the tri-stated condition, without adverse effects. That is, the output node 10 can go above 3.3 V plus the threshold voltage of a P-channel transistor; when this occurs, a p-channel transistor 23 turns on and allows the gate 13 (the Drive-hi voltage) to follow the output node 10, thus keeping the P-channel output transistor 11 from turning on and so preventing current from sinking into the $V_{dd3}$ supply. If the transistor 23 did not provide this function, a +5 V level on the output node 10, with the gate 13 at +3.3 V and the source 24 of the transistor 11 at +3.3 V, would turn on the transistor 11 to conduct current from the node 10 to the voltage supply $V_{dd3}$. However, by allowing the gate 13 to follow the voltage on the output node 10, this undesirable operation is prevented. In order to prevent this higher voltage on the gate 13 from sinking into the power supply $V_{dd3}$ via the transistor 18, however, an N-channel pass transistor 25 couples the drain node 26 of the transistor 18 to the node 13, and functions by body effect and by its source-to-drain resistance to prevent the overvoltage on the node 13 from discharging into the $V_{dd3}$ supply through the source-to-drain path of the transistor 18. The transistor 25 has its gate 27 to connected to a +5 V supply, $V_{dd5}$. The +5 V supply voltage is also connected to the N-well for the P-channel transistor 18. The transistor 25 "holds" the voltage at the node 26 close to $V_{dd3}$ due to the resistive and body effect. Since the node 26 is held close to the supply $V_{dd3}$, a minimum of current is sunk into the chip power supply by this path.

Figure 2:
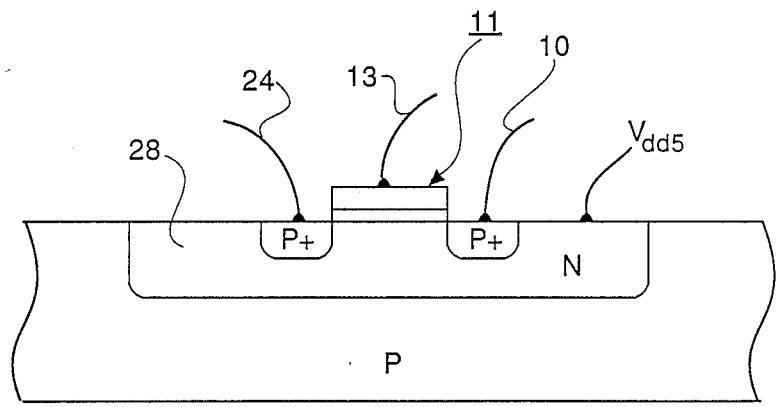
FIG. 2 is an elevation view in section of a small part of a semiconductor chip containing the output P-channel pull-up transistor of the circuit of FIG. 1.

Referring to FIG. 2, an N-well 28 in which the P-channel transistors 11 and 23 are formed is connected to the +5 V supply $V_{dd5}$, so the PN junctions between the P+ source and drain regions of these transistors 11 and 23 will not become forward biased when the node 10 goes above the value of $V_{dd3}$ plus a diode drop. While FIG. 2 shows an N-well technology, it is understood that the features of the invention are applicable to twin-tub technology, and also to P-well if the substrate is tied to +5 V.

Although the particular device sizes employed will depend upon the design rules, the intended drive capacity, and various other factors, one example of the sizing of the transistors in the circuit of FIG. 1 is the use of a 1600×1 size for the P-channel pull-up transistor 11, a 1250×2.5 size for the N-channel pull-down transistor 12 (a longer channel length to minimize hot electron effects), a small 75×1 device size for the P-channel load transistor 18 in the inverter, and a 200×4 size for the series N-channel transistor 25 (also long-channel to avoid AC stress). The shunt transistor 23 is 250×1.

The series N-channel transistor 25 with its gate 27 tied to the high voltage supply +5 V and the P-channel shunt transistor 23 with its gate tied to +3.3 V (the low supply voltage) together allow the gate 13 of the output P-channel pull-up transistor 11 to follow the output voltage on the node 10 when this output voltage exceeds +3.3 V plus the magnitude of a P-channel threshold voltage. Simultaneously, the series N-channel transistor 25 keeps the voltage at its source node 26 close to +3.3 V (low-voltage supply level), thus preventing a large current from sinking into the low voltage supply. If the gate 27 of the transistor 25 were tied to +3.3 V instead of +5 V, the circuit would not allow the node 13 to be deasserted (driven to +3.3 V), due again to the body effect.

The series N-channel transistor 25 performs the desired function due to the body effect, which is the change in threshold voltage brought about by an elevated source voltage. In most CMOS applications, $V_{source} = V_{substrate} = 0$ V for the N-channel transistors, whereas in the circuit of FIG. 1 $V_{source}$ for the transistor 25 is equal to about +3.3 V, which raises the threshold voltage of the device and so the channel pinches off when the gate-to-source voltage of the transistor 25 equals this higher threshold. Or, in other words, since the gate-to-drain voltage is approximately equal to zero (gate is at 5 V and the drain is at about 5 V), then the drain-to-source voltage is about the same as the gate-to-source voltage and about the same as the threshold voltage, i.e., $V_{ds} = V_{gs} = V_{th}$. Since $V_{th}$ is higher, there is a larger drop across $V_{ds}$ or the channel.

Normally, a pass transistor will be driving a capacitive load and thus the current flow would drop to zero and the voltage drop across the channel, $V_{ds}$, will be simply the higher $V_{th}$ caused by the body effect. However, in this application of the circuit the current does not drop to zero so there is an IR drop across the channel also. So the advantage of the circuit of FIG. 1 using the pass transistor 25 is that it takes advantage of both the body effect and the channel IR drop since the current does not drop to zero (unless the output voltage drops to $(+3.3 \text{ V}+V_{thp})$. Note that sizing is used to optimize the operation of this circuit in this regard as well as in the normal driving operation.

Previously, the problem of sinking current into the supply through the P-channel pull-up transistor 11 in an output buffer of this type was solved by a two-transistor stack instead of the single transistor 11. An example of such a circuit is seen in U.S. Pat. No. 4,782,250. The problem with the two-transistor stack is that the transistors of the stack must have device widths twice as large as that of a single pull-up transistor to maintain the same drive capability. Thus a stack pull-up transistor requires four times the area compared to a single pull-up transistor. For example, in an embodiment of the circuit of FIG. 1, the transistor 11 has a size of 1600:1 μm, but a two-transistor stack of equal capability would require two 3200:1 μm transistors. The predrive logic would also have to be sized accordingly for a two-transistor stack; twice the area/loading for predrive logic or clocking would be required.

Another advantage of the circuit of FIG. 1 is the ability to reduce hot electron effects. Assume that a 32-bit bus, having a circuit of FIG. 1 connected at node 10 to each bit (thus thirty-two of these circuits), is at +5 V and all of the thirty-two driver circuits tri-state. The circuit of FIG. 1 in this case will allow the charge on the bus lines to slowly leak off so the level will be at $V_{dd3}$ plus a P-channel threshold voltage before the next bus cycle (it being understood that in some cases there will be several of the FIG. 1 circuits connected to each bit of the bus, since some buses can be driven from several sources). Thus, since the voltage at the time of switching could be reduced from the +5 V level, the channel length of the N-channel pull-down transistor 12 can be shorter without rendering the device vulnerable to hot-electron effects. Thus, more area on the chip is saved, both in the size of the transistor 12 and in its drive circuitry. Loading of these nodes is also reduced.

In a prior circuit, the sinking of current into the power supply through a P-channel pull-up transistor used a two-transistor stack as mentioned above, and employed the technique of forward biasing the source-/drain PN junctions of one of the pull-up transistors and charging the N-wells. However, one undesirable result was that when the output voltage goes low the charge in the wells will discharge into the supply, creating a current transient. This effect is not present in the circuit of FIG. 1.

The advantageous features of the circuit of FIG. 1 are provided at the expense of requiring an extra $V_{dd5}$ supply to the chip, but this only means one pin since there is no dynamic loading on this +5 V input. Indeed, in one embodiment, the +5 V supply is needed on the chip for other purposes (ESD or electrostatic discharge protection), so the +5 V supply is not an added burden at all. Alternatively a charge pump can be used to create $V_{dd5}$ internally.

Figure 3:
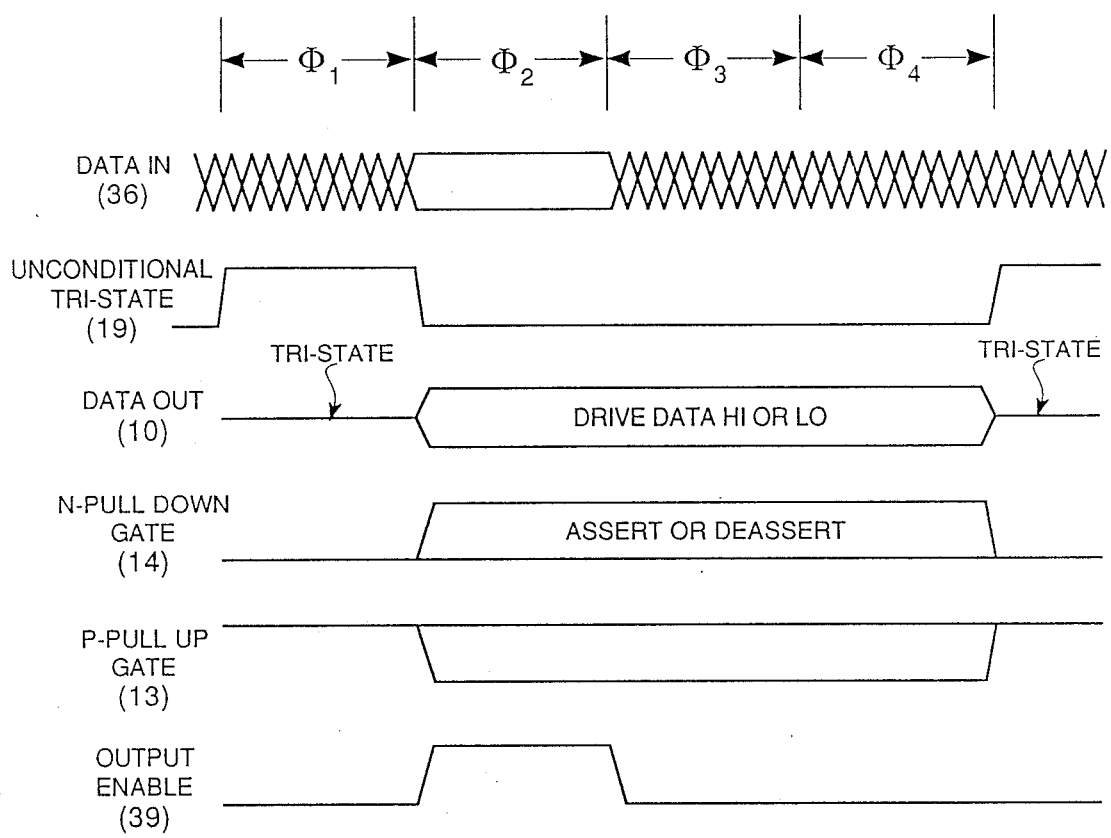
FIG. 3 is a timing diagram showing voltage vs. time for signals appearing in the circuit of FIG. 1.

Another encumbrance of the circuit of FIG. 1 is that the deassertion of the Drive-hi voltage on gate 13 from input 16 is delayed due to the presence of the pass transistor 25 and due to the sizing for optimization of the circuit. That is, when input 16 goes low, the gate 13 must go to its deasserted condition, $V_{dd3}$, and this requires charging the node 13 through the transistors 18 and 25 which have been intentionally made small. If the voltage Drive-hi on node 13 is not deasserted prior to the assertion of Drive-lo on node 14, there could be a large output crossover current. In this embodiment, to prevent this crossover current, the node 13 is unconditionally deasserted before every drive cycle by forcing the input 16 low prior to the beginning of every machine cycle where the inputs 31 and 16 are to be driven with data. There are several embodiments which will be suggested to those skilled in the art. In this embodiment, referring to FIG. 3, if the operating cycle of the system in which the chip containing the circuit of FIG. 1 includes four phases, $\Phi_1$, $\Phi_2$, $\Phi_3$ and $\Phi_4$, and the input signal 36 is valid and signal 39 is high, during the time period $\Phi_2$, node 19 will be driven high during each phase $\Phi_1$ to deassert the nodes 13 and 14, i.e., to unconditionally tri-state the output 10. The drive circuit in FIG. 1 includes a pair of pass transistors 32 and 33 which are driven from a voltage on a node 34 which is valid during $\Phi_2$. When this voltage on node 34 goes high, the N-channel transistor 33 is turned on and also the P-channel transistor 32 is turned on via inverter 35, latching the output of NOR gate 37 and NAND gate 38. Input data on anode 36 is applied to the circuit through a NOR gate 37 and a NAND gate 38. An output enable signal on a node 39, when at a logic "1" level (+3.3 V in the example), enables the NAND gate 38 to allow the data from input 36 to be applied (inverted) through the pass transistor 33 to the inverter 15, and appears as a logic "0" at the input of the NOR gate 37 via inverter 40 so data on the input 36 is applied (inverted) to node 16. When the output enable voltage on node 39 is at logic "0", the output of the NAND gate 38 is high and thus the output of the inverter 15 is low, while the output of the NOR gate 37 is low (regardless of the data input 36) and the Drive-hi voltage on the node 13 is high, so the output 10 is in the tri-state condition. Thus, to tri-state the output buffer circuit for the entire cycle, the output-enable node 39 is driven low during $\Phi_2$.

The circuit of FIG. 1 has been described with reference to the use of +3.3 V and +5 V supplies, but it is understood that the features of the invention are applicable as well to other supply voltage combinations, such as +2.0/+3.3 V, or +2.5/+5 V, for example.

While this invention has been described with reference to a specific embodiment, this description is not meant to be construed in a limiting sense. Various modifications of the disclosed embodiment, as well as other embodiments of the invention, will be apparent to persons skilled in the art upon reference to this description. It is therefore contemplated that the appended claims will cover any such modifications or embodiments as fall within the true scope of the invention.

What is claimed is:

1. An output buffer circuit, comprising:
   a) an N-channel pull-down transistor and a P-channel pull-up transistor, each of said transistors having a source-to-drain path and a gate;
   b) the source-to-drain paths of the pull-down and pull-up transistors being connected in series across a voltage supply of a given value, and an output node between said source-to-drain paths being connected to a buffer output;

c) logic input means for said buffer circuit applying a separate logic inputs to said gates of said pull-down and pull-up transistors; and d) a P-channel shunt transistor having a source-to-drain path connected between said gate of said pull-up transistor and said output node and having a gate connected to said voltage supply of a given value to allow said gate of said pull-up transistor to follow the voltage of said output node.

2. A circuit according to claim 1 wherein said P-channel pull-up transistor and said P-channel shunt transistor each have an N-well coupled to a voltage supply higher than said voltage supply of a given value, to thereby avoid forward bias of the PN junction of the source and drain regions of said P-channel transistors.

3. A circuit according to claim 2 wherein said input logic means includes an inverter driving said gate of said pull-up transistor, and means provided for preventing overvoltage on said gate of the pull-up transistor from sinking current into a source of supply voltage for said inverter.

4. A circuit according to claim 1 wherein said logic means includes inverting means having first and second N-channel transistors and a first P-channel transistor each having a gate and all having source-to-drain paths connected in series across said voltage supply of a given value, the source-to-drain of said first N-channel transistor being connected between said gate of said pull-up transistor and a reference potential.

5. A circuit according to claim 4 wherein a logic voltage input is connected to said gate of said first N-channel transistor and to said gate of said first P-channel transistor.

6. A circuit according to claim 5 wherein said gate of said second N-channel transistor is connected to a second voltage supply of a value higher than said given value.

7. A circuit according to claim 1 wherein said P-channel pull-up transistor and said P-channel shunt transistor both have an N-well connected to a voltage supply higher than said given value, to thereby prevent the PN junction of said source-to-drain path from being forward biased by overvoltage on said output node.

8. A circuit according to claim 1 wherein said supply voltage of a given value is about +3.3 V.

9. A circuit according to claim 7 wherein said voltage supply of a value higher than said given value is about +5 V.

10. An output buffer circuit, comprising:
a) a first transistor and a second transistor, each of said transistors having a source-to-drain path and a gate;
b) the source-to-drain paths of the first and second transistors being connected in series across a first voltage supply, and an output node between said source-to-drain paths being connected to a buffer output;
c) logic input means for said buffer circuit applying separate logic inputs to said gates of said first and second transistors;

d) a third transistor having a source-to-drain path connected between said gate of said second transistor and said output node and having a gate connected to said voltage supply of a given value, to allow said gate of said second transistor to follow an overvoltage on said output node.

11. A circuit according to claim 10 wherein said third transistor has the same channel type as said second transistor, and said first and second transistors have opposite channel types.

12. A circuit according to claim 11 wherein said first transistor is N-channel and said second and third transistors are P-channel.

13. A circuit according to claim 10 wherein said logic means includes inverting means having fourth and fifth transistors of the same channel type as said first transistor and a sixth transistor of the same channel type as said second transistor, each of said fourth, fifth and sixth transistors having a gate and all having source-to-drain paths connected in series across said voltage supply of a given value, said source-to-drain path of said fourth transistor being connected between said gate of said second transistor and reference potential.

14. A circuit according to claim 13 wherein a logic input is connected to said gate of said fourth transistor and to said gate of said sixth transistor.

15. A circuit according to claim 14 wherein said gate of said fifth transistor is connected to a second voltage supply of a value higher than said given value.

16. A circuit according to claim 10 wherein said second transistor and said third transistor both have a well connected to a voltage supply higher than said given value, to thereby prevent the PN junction of said source-to-drain path from being forward biased by overvoltage on said output node.

17. A circuit comprising: an output node; a pull-up transistor having a gate and having a source-to-drain path connecting said output node to a source of voltage of a given value; logic means driving said gate with logic voltage; means connected between said gate and said output node to allow said gate to follow the voltage of said output node to a voltage above said given value to thereby prevent said pull-up transistor from turning on to sink current into said source; and means to prevent a PN junction of said source-to-drain path from becoming forward biased by said voltage above said given value.

18. A circuit according to claim 17 wherein said means connected between said gate and output node is a source-to-drain path of a transistor having its gate connected to said source of voltage.

19. A circuit according to claim 17 wherein said means to prevent includes a well in which said source-to-drain path is formed connected to a voltage above said given value.

20. A circuit according to claim 17 wherein said logic means includes means for preventing said gate from sinking current to a voltage supply of said given value connected to said logic means, when said gate is at a voltage above said given value.

* * * * *

UNITED STATES PATENT AND TRADEMARK OFFICE
CERTIFICATE OF CORRECTION

PATENT NO. : 4,963,766
DATED : Oct. 16, 1990
INVENTOR(S) : James R. Lundberg

It is certified that error appears in the above-identified patent and that said Letters Patent is hereby corrected as shown below:

Column 7, line 27, after "source-to-drain" insert --path--.

Signed and Sealed this

First Day of February, 1994

Attest:

BRUCE LEHMAN

Attesting Officer     Commissioner of Patents and Trademarks

REEXAMINATION CERTIFICATE (1766th)
United States Patent [19]

Lundberg

[11] B1 4,963,766

[45] Certificate Issued Aug. 4, 1992

[54] LOW-VOLTAGE CMOS OUTPUT BUFFER

[75] Inventor: James R. Lundberg, Hubbardston, Mass.

[73] Assignee: Digital Equipment Corporation

Reexamination Request:
No. 90/002,585, Feb. 18, 1992

Reexamination Certificate for:
Patent No.: 4,963,766
Issued: Oct. 16, 1990
Appl. No.: 372,670
Filed: Jun. 28, 1989

[51] Int. Cl.⁵ .................. H03K 19/094; H03K 19/20; H03K 17/687; H03K 19/003
[52] U.S. Cl. .................................. 307/451; 307/473; 307/562; 307/568
[58] Field of Search .............. 307/451, 443, 473, 572, 307/568, 491, 562, 4

[56] References Cited
U.S. PATENT DOCUMENTS

| | | | |
|---|---|---|---|
| 4,267,465 | 5/1981 | Haug et al. | 307/443 |
| 4,678,943 | 7/1987 | Uragami et al. | 307/473 |
| 4,772,812 | 9/1988 | Desmarais | 307/473 |
| 4,782,250 | 11/1988 | Adams et al. | 307/473 |
| 4,800,303 | 1/1989 | Graham et al. | 307/558 X |
| 4,806,801 | 2/1989 | Argade et al. | 307/568 X |
| 4,820,942 | 4/1989 | Chan | 307/473 X |
| 4,855,623 | 8/1989 | Flaherty | 307/473 X |
| 4,864,164 | 9/1989 | Ohshima et al. | 307/451 X |
| 4,866,304 | 9/1989 | Yu | 307/451 X |
| 4,880,997 | 11/1989 | Steele | 307/473 X |

FOREIGN PATENT DOCUMENTS 0135075 3/1985 European Pat. Off.
WO89/00361 1/1989 PCT Int'l Appl.

*Primary Examiner*—J. Zazworsky

[57] ABSTRACT

A CMOS push-pull output buffer is powered by a low-voltage (e.g., +3.3 V) supply, but is able to withstand elevation of its output node to higher voltage without sinking large currents into the low-voltage supply. Thus, this buffer is able to operate tied to a bus that has various higher-voltage sources also operating on the bus. The P-channel pull-up transistor of this buffer has another P-channel transistor connecting its gate to the output node so that this gate will follow the voltage of the output node and thus keep the pull-up transistor from conducting from the output node to the power supply. The inverter which drives this gate of the P-channel pull-up transistor is also protected from reverse current into its low-voltage power supply by a series N-channel transistor which will exhibit body effect and is sized to present a significant resistance.

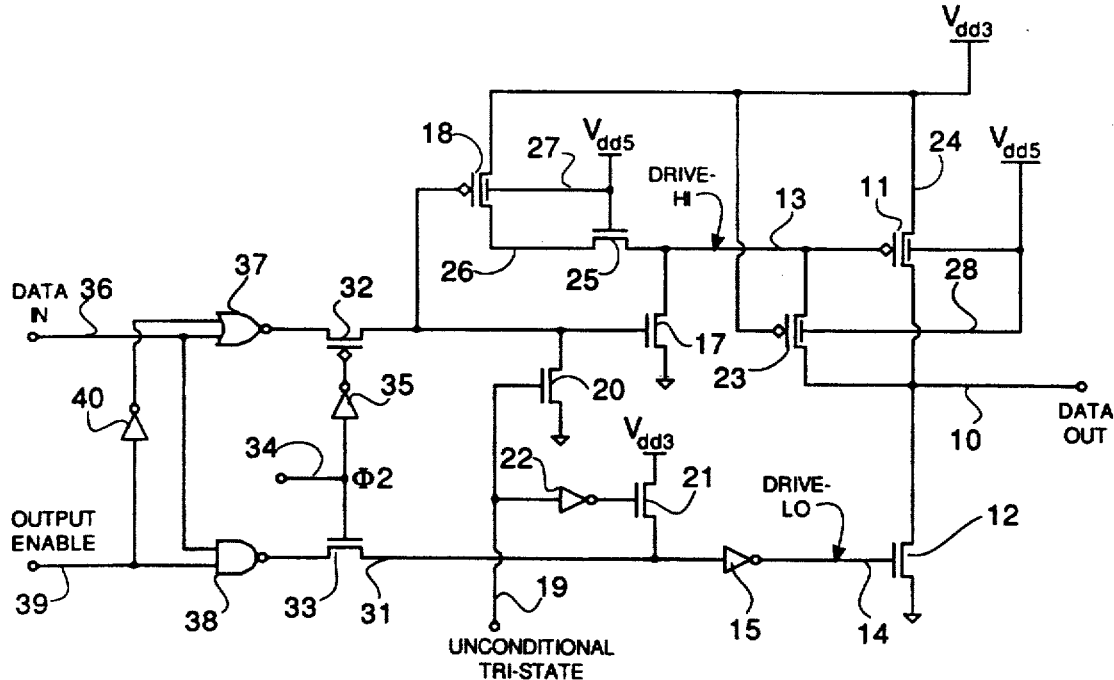

REEXAMINATION CERTIFICATE ISSUED UNDER 35 U.S.C. 307

NO AMENDMENTS HAVE BEEN MADE TO THE PATENT

AS A RESULT OF REEXAMINATION, IT HAS BEEN DETERMINED THAT:

The patentability of claims 1 to 19 and 20 is confirmed.

* * * * *